United States Patent
Suda et al.

(10) Patent No.: US 9,641,108 B2
(45) Date of Patent: May 2, 2017

(54) METHOD AND SYSTEM FOR CALIBRATING AND DETECTING OFFSET OF ROTARY ENCODER RELATIVE TO ROTOR OF MOTOR

(71) Applicant: Eaton Corporation, Cleveland, OH (US)

(72) Inventors: Bharath Suda, Pune (IN); James David, Portage, MI (US)

(73) Assignee: Eaton Corporation, Cleveland, OH (US)

(*) Notice: Subject to any disclaimer, the term of this patent is extended or adjusted under 35 U.S.C. 154(b) by 67 days.

(21) Appl. No.: 14/581,100

(22) Filed: Dec. 23, 2014

(65) Prior Publication Data
US 2015/0303845 A1    Oct. 22, 2015

Related U.S. Application Data

(60) Provisional application No. 61/980,067, filed on Apr. 16, 2014.

(51) Int. Cl.
*H02P 6/16* (2016.01)
*G01R 23/00* (2006.01)

(52) U.S. Cl.
CPC ............... *H02P 6/16* (2013.01); *G01R 23/00* (2013.01)

(58) Field of Classification Search
CPC ........ H02K 19/103; H02K 29/08; H02K 7/06; H02K 11/33; H02K 21/14; H02K 11/21; H02K 29/14; H02K 11/215; H02K 19/06; H02K 21/12; H02K 29/06; H02K 37/14; H02K 57/006; H02K 11/24; H02P 25/08; H02P 6/14; H02P 2203/01; H02P 23/16
See application file for complete search history.

(56) References Cited

U.S. PATENT DOCUMENTS

| | | | |
|---|---|---|---|
| 2003/0213896 A1* | 11/2003 | Stridsberg ............ | G01D 5/2451 250/231.13 |
| 2007/0159124 A1* | 7/2007 | Wasson .................. | G04C 3/143 318/400.06 |
| 2009/0230824 A1* | 9/2009 | Hornberger ............ | G01D 5/145 310/68 B |
| 2010/0090633 A1* | 4/2010 | Deller .................... | H02K 29/08 318/400.39 |
| 2012/0013279 A1* | 1/2012 | Setbacken ............ | G01D 5/3473 318/400.4 |
| 2012/0038298 A1* | 2/2012 | Villwock ............... | G01R 31/34 318/400.11 |
| 2012/0038299 A1* | 2/2012 | Villwock ............... | G01R 31/34 318/400.12 |
| 2012/0038303 A1* | 2/2012 | Villwock ............... | G01R 31/34 318/400.33 |
| 2012/0038311 A1* | 2/2012 | Villwock ............... | G01R 31/34 318/806 |

(Continued)

*Primary Examiner* — Marlon Fletcher
(74) *Attorney, Agent, or Firm* — Mei & Mark LLP

(57) ABSTRACT

Methods and systems for operating a motor having a rotor rotatable relative to a stator include commutating the motor to cause the rotor to rotate to a known position. While the rotor is at the known position, a position of an encoder magnet configured to rotate with the rotor is measured. Subsequent commutation of the motor is adjusted to take into account a difference between the known position of the rotor and the measured position of the encoder magnet.

17 Claims, 4 Drawing Sheets

(56) References Cited

U.S. PATENT DOCUMENTS

| | | | | |
|---|---|---|---|---|
| 2013/0082633 A1* | 4/2013 | Eaton | ................ | H02P 6/15 |
| | | | | 318/490 |
| 2014/0184030 A1* | 7/2014 | Labriola, II | ......... | G01D 5/2451 |
| | | | | 310/68 B |
| 2015/0084446 A1* | 3/2015 | Atar | .............. | H02K 16/00 |
| | | | | 310/43 |
| 2015/0303845 A1* | 10/2015 | Suda | .............. | G01R 23/00 |
| | | | | 318/400.38 |
| 2016/0003641 A1* | 1/2016 | Kaufner | ............ | H02K 29/08 |
| | | | | 310/68 B |

* cited by examiner

METHOD AND SYSTEM FOR CALIBRATING AND DETECTING OFFSET OF ROTARY ENCODER RELATIVE TO ROTOR OF MOTOR

CROSS-REFERENCE TO RELATED APPLICATIONS

This application claims the benefit of U.S. Provisional Application No. 61/980,067, filed Apr. 16, 2014; the disclosure of which is hereby incorporated in its entirety by reference herein.

TECHNICAL FIELD

The present invention relates to operating a motor based on rotary position of a rotor of the motor.

BACKGROUND

Position sensors such as encoders and Hall-effect sensors provide motor position information. Motor operation depends on accurate motor position information, especially for permanent magnet brushless motors. For instance, phase excitation for torque production is controlled according to motor position information.

Commutation (i.e., phase excitation) of the stator windings of a motor is controlled according to detected position of the rotor of the motor. Calibration of rotor position relative to the stator is done at a production facility through end of line calibration. Such calibration includes calibration of rotor position offset relative to the stator magnetic field. The motor leads (e.g., three phase) are designated or color coded for proper connectivity to electronic controller terminals. Wrong connections lead to improper calibration and operation of the motor. A problem is that ordinary calibration processes require relatively much effort and expense.

Some motor systems include a magnetic rotary encoder to monitor the rotary position of the rotor relative to the stator. A magnetic rotary encoder typically includes a relatively small two pole encoder magnet. The encoder magnet is mounted onto the rotor shaft to rotate as the rotor rotates. A magnetic sensor of the encoder detects the rotary position of the encoder magnet. The detected rotary position of the encoder magnet corresponds to the rotary position of the rotor when the encoder magnet is aligned with a reference point of the rotor from which the rotary position of the rotor is to be measured.

However, the alignment between the encoder magnet and the rotor is arbitrary upon the encoder magnet being mounted onto the rotor shaft during motor manufacture. As such, the encoder magnet is aligned with an arbitrary point of the rotor as opposed to the reference point of the rotor. Calibration is performed to identify the offset in alignment of the encoder magnet, which is aligned with the arbitrary point of the rotor, relative to the reference point of the rotor. The summation of the detected rotary position of the encoder magnet and the offset in alignment corresponds to the rotary position of the rotor.

For instance, the arbitrary point of the rotor is 40° apart from the reference point of the rotor in the clockwise direction. Hence, the arbitrary point leads the reference point by 40°. Thus, the detected rotary position of the encoder magnet (for example, 150°) is +40° more than the rotary position of the rotor (in this example, 110°). Therefore, +40° is subtracted from the detected rotary position of the encoder magnet to obtain the rotary position of the rotor.

The relationship of the summation of the detected rotary position of the encoder magnet and the offset in alignment corresponding to the rotary position of the rotor holds as long as the encoder magnet is aligned with the arbitrary point. A problem is that the orientation of the encoder magnet may change with respect to the rotor shaft during motor operation. For instance, the encoder magnet may become loosened and move during the lifetime of the motor. As a result, the encoder magnet moves out of alignment with the initial arbitrary point of the rotor and becomes aligned with some other arbitrary point of the rotor (which could even be the reference point of the rotor). As a result, the offset in alignment of the encoder magnet relative to the reference point becomes different than the offset originally calibrated.

Proper motor operation cannot occur without accurate rotary position of the rotor as motor commutation is controlled according to the rotary position of the rotor. Further, sometimes it may not be discernible that the encoder magnet has moved out of the calibrated alignment with the rotor. As such, motor operation based on the resulting faulty rotary position information provided by the encoder may be understood to be proper when in fact the motor operation is improper.

SUMMARY

An object of the present invention includes calibrating offset in alignment between an encoder magnet and a reference point of a rotor of a motor from which the rotary position of the rotor is to be measured such that the detected rotary position of the encoder magnet adjusted with the offset in alignment corresponds to the rotary position of the rotor whereby the motor is operated with accurate rotor rotary position information.

Another object of the present invention includes detecting a change in the offset in alignment between the encoder magnet and the reference point of the rotor and re-calibrating the offset in alignment between the encoder magnet and the reference point of the rotor.

Another object of the present invention includes rotor offset angle calibration for any phase connections.

In carrying out at least one of the above and other objects, the present invention provides a method for operating a motor. The method includes commutating the motor to cause a rotor to rotate relative to a stator to a known position. While the rotor is at the known position, a position of an encoder magnet configured to rotate with the rotor is measured. Subsequent commutation of the motor is adjusted to take into account a difference between the known position of the rotor and the measured position of the encoder magnet.

The method may include detecting an alignment offset between the rotor and the encoder magnet as the difference between the known position of the rotor and the measured position of the encoder magnet. In this case, the method may further include using the measured position of the encoder magnet adjusted by the alignment offset to be a measured position of the rotor for the subsequent commutation of the motor.

The method may include repeating commutating the motor to cause the rotor to rotate to the known position and measuring the position of the encoder magnet for each commutation while the rotor is at the known position. In this case, adjusting subsequent commutation of the motor further includes taking into account a difference between the known position of the rotor and a value representative of the measured position of the encoder magnet for the commutations.

The method may include commutating the motor a second time to cause the rotor to rotate to a second known position and measuring a second position of the encoder magnet while the rotor is at the second known position. In this case, adjusting subsequent commutation of the motor further includes taking into account an alignment offset value based on (i) the difference between the known position of the rotor and the measured position of the encoder magnet and (ii) a difference between the second known position of the rotor and the second measured position of the encoder magnet.

The method may include commutating the motor a second time to cause the rotor to rotate to a second known position, measuring a second position of the encoder magnet while the rotor is at the second known position, and detecting an amount of poles of the rotor based on a difference between the measured positions of the encoder magnet.

The method may include, after the subsequent commutation of the motor, repeating commutating the motor to cause the rotor to rotate to a known position, measuring a position of the encoder magnet while the rotor is at the known position, and adjusting further subsequent commutation of the motor to take into account a difference between the known position of the rotor and the measured position of the encoder magnet of the repeated commutations.

Also, in carrying out at least one of the above and other objects, the present invention provides an assembly including a motor, magnetic encoder assembly, and a controller. The motor includes a rotor rotatable relative to a stator. The magnetic encoder assembly has an encoder magnet configured to rotate with the rotor. The controller is configured to commutate the motor to cause the rotor to rotate to a known position, communicate with the magnetic encoder assembly to measure a position of the encoder magnet while the rotor is at the known position, and adjust subsequent commutation of the motor to take into account a difference between the known position of the rotor and the measured position of the encoder magnet.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
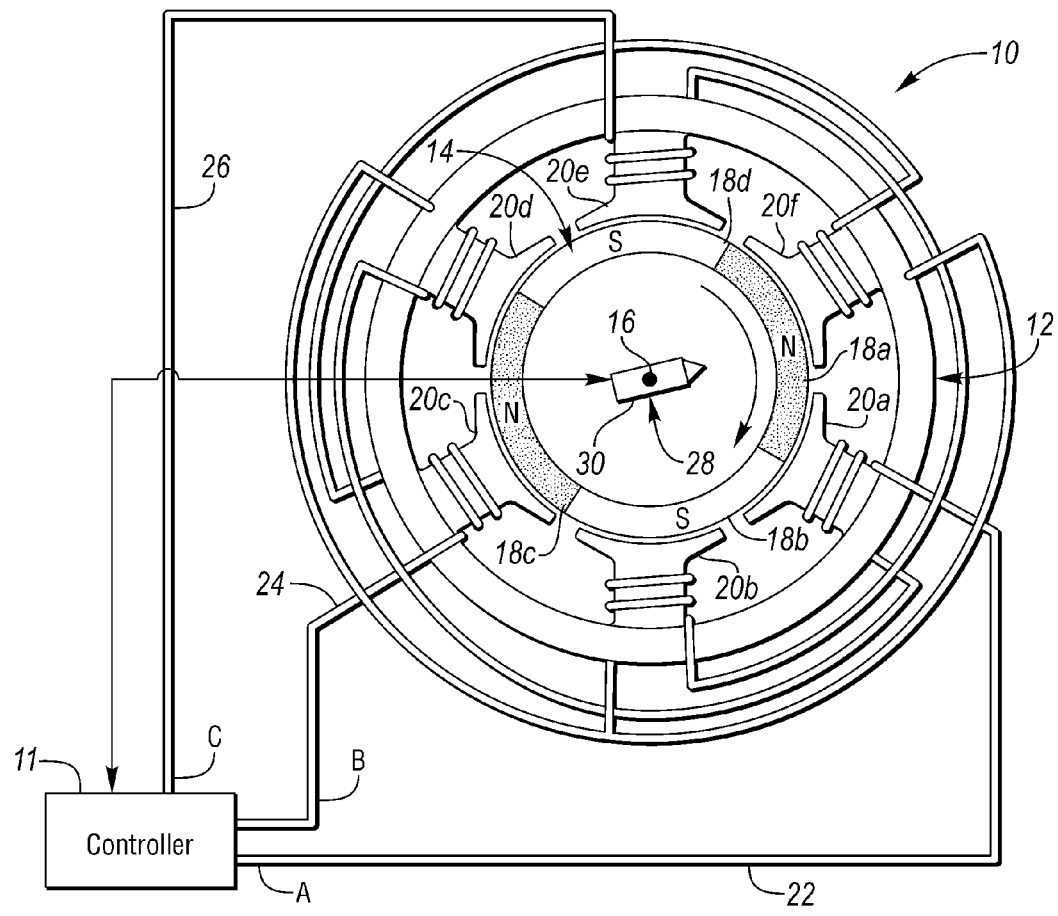
FIG. 1 illustrates a schematic drawing of an exemplary motor for use with embodiments of the present invention.

Referring now to FIG. 1, a schematic drawing of an exemplary motor 10 for use with embodiments of the present invention is shown. As an example, motor 10 is a permanent magnet brushless DC motor having a stator 12 and a rotor 14. Stator 12 is fixed in place and rotor 14 is rotatable relative to the stator. Rotor 14 is mounted to a rotor shaft 16 which rotates as the rotor rotates. As an example, rotor 14 includes four rotor poles 18a, 18b, 18c, and 18d. Thus, rotor includes two rotor pole pairs. As an example, stator 12 includes six stator poles 20a, 20b, 20c, 20d, 20e, and 20f as shown in FIG. 1. Stator poles 20 are spatially positioned 120° apart from one another.

Motor 10 is a three-phase motor with three coils respectively wound about each of three pairs of the stator poles. In particular, a first coil 22 corresponding to phase A is wound about each of a first pair of stator poles 20a and 20d; a second coil 24 corresponding to phase B is wound about each of a second pair of stator poles 20c and 20f; and a third coil 26 corresponding to phase C is wound about each of a third pair of stator poles 20b and 20e. A controller 11 commutates motor 10 by exciting coils 22, 24, and 26 in a sequence (e.g., ABC; ACB) which causes rotor 14 to rotate relative to stator 12.

Motor 10 further includes a magnetic rotary encoder 28 for monitoring the rotary position of rotor 14 relative to stator 12. Encoder 28 includes an encoder magnet 30. Encoder magnet 30 is mounted onto rotor shaft 16 at a distance from the vicinity of rotor 14. As such, a fixed magnetic sensor (not shown) sensing encoder magnet 30 is unaffected by magnetic fields emanating between rotor poles 18 and stator poles 20. As encoder magnet 30 is mounted onto rotor shaft 16 the encoder magnet rotates as rotor 14 rotates relative to stator 12. The rotary position of encoder magnet 30 is detected by the magnetic sensor which senses the encoder magnet. Controller 11 receives a signal from the magnetic sensor indicative of the detected rotary position of encoder magnet 30.

The rotary position of encoder magnet 30 corresponds to the rotary position of rotor 14 when the encoder magnet is aligned with a reference point of the rotor from which the rotary position of the rotor is to be measured. However, the alignment between encoder magnet 30 and rotor 14 is arbitrary. As such, encoder magnet 30 is typically not aligned with the reference point of rotor 14 and is instead aligned with some other arbitrary point of the rotor. Accordingly, encoder magnet 30 is out of alignment with the reference point of rotor 14 in an offset amount equal to the angular difference between the arbitrary and reference points of the rotor. In this case, the rotary position of encoder magnet 30 adjusted by the offset in alignment corresponds to the rotary position of rotor 14.

Figure 2A:
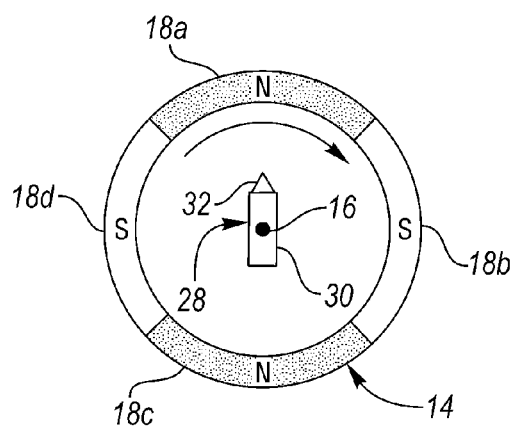
FIG. 2A illustrates a schematic drawing of the rotor of the motor and an encoder magnet in which the encoder magnet is aligned with a reference point of the rotor, from which the rotary position of the rotor is to be measured, as no alignment offset is between the encoder magnet and the reference point of the rotor.
Figure 2B:
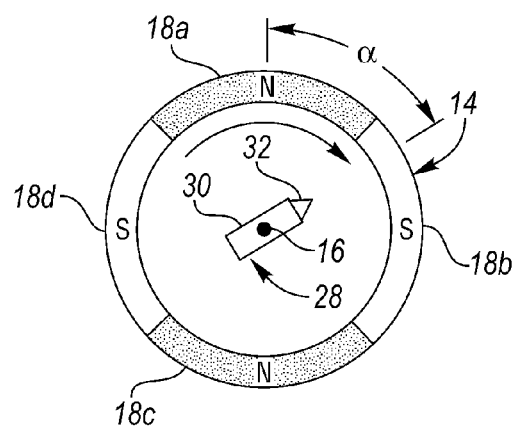
FIG. 2B illustrates a schematic drawing of the rotor and the encoder magnet in which the encoder magnet is out of alignment with the reference point of the rotor as an alignment offset is between the encoder magnet and the reference point of the rotor.

Referring now to FIGS. 2A and 2B, with continual reference to FIG. 1, respective schematic drawings of rotor 14 and encoder 28 are shown. Encoder magnet 30 is shown in FIGS. 1, 2A, and 2B as having an arrowhead 32. Arrowhead 32 is a symbolic representation from which the rotary position of encoder magnet 30 is to be measured. Arrowhead 32 points at some point of rotor 14 such that encoder magnet 30 is aligned with that point of the rotor.

The detected rotary position of encoder magnet 30 corresponds to the rotary position of rotor 14 when arrowhead 32 is aligned with a reference point of the rotor from which the rotary position of the rotor is to be measured. For example, the reference point of rotor 14 is the "N" of rotor pole 18a.

In FIG. 2A, arrowhead 32 of encoder magnet 30 is points to the reference point of rotor 14 (which is the "N" of rotor pole 18a). Thus, encoder magnet 30 is aligned with the reference point of rotor 14 as no alignment offset is between the encoder magnet and the reference point. In this case, the rotary position of encoder magnet 30 corresponds to the rotary position of rotor 14.

In FIG. 2B, arrowhead 32 of encoder magnet 30 points to some arbitrary point other than the reference point of rotor 14. Thus, encoder magnet 30 is not in alignment with the reference point of rotor 14 as an alignment offset is between the encoder magnet and the reference point. In this case, the rotary position of encoder magnet 30 does not correspond to the rotary position of rotor 14. In particular, an angular offset α in alignment is between encoder magnet 30 and the reference point of rotor 14. As such, the rotary position of encoder magnet 30 differs from the rotary position of rotor 14 in the angular offset α. Thus, the detected rotary position of encoder magnet 30 adjusted in the amount of the alignment offset α corresponds to the rotary position of rotor 14.

Encoder magnet 30 is attached to rotor shaft 16 during manufacturing of motor 10 such that the encoder magnet is at a rotary position in which arrowhead 32 points to some arbitrary point of rotor 14, such as shown in FIG. 2B. A problem is that the arbitrary point most likely will always be some point of rotor 14 other than the reference point of rotor 14 from which the rotary position of the rotor is to be measured. Accordingly, calibration is required to identify the offset in alignment of encoder magnet 30 relative to a reference point of the rotor from which the rotary position of the rotor is to be measured. The summation of the detected rotary position of encoder magnet 30 and the offset in alignment corresponds to the rotary position of rotor 14. In turn, motor commutation (i.e., phase excitation) of coils 22, 24, and 26 is controlled according to the rotary position of rotor 14.

The relationship of the summation of the detected rotary position of encoder magnet 30 and the offset in alignment corresponding to the rotary position of rotor 14 holds as long as the encoder magnet is aligned with the arbitrary point. Another problem is that the orientation of encoder magnet 30 may change with respect to rotor shaft 16 during motor operation such that arrowhead 32 points to some other arbitrary point of rotor 14. Accordingly, another round of calibration is required to account for the new orientation of encoder magnet 30 relative to rotor 14.

Figure 3:
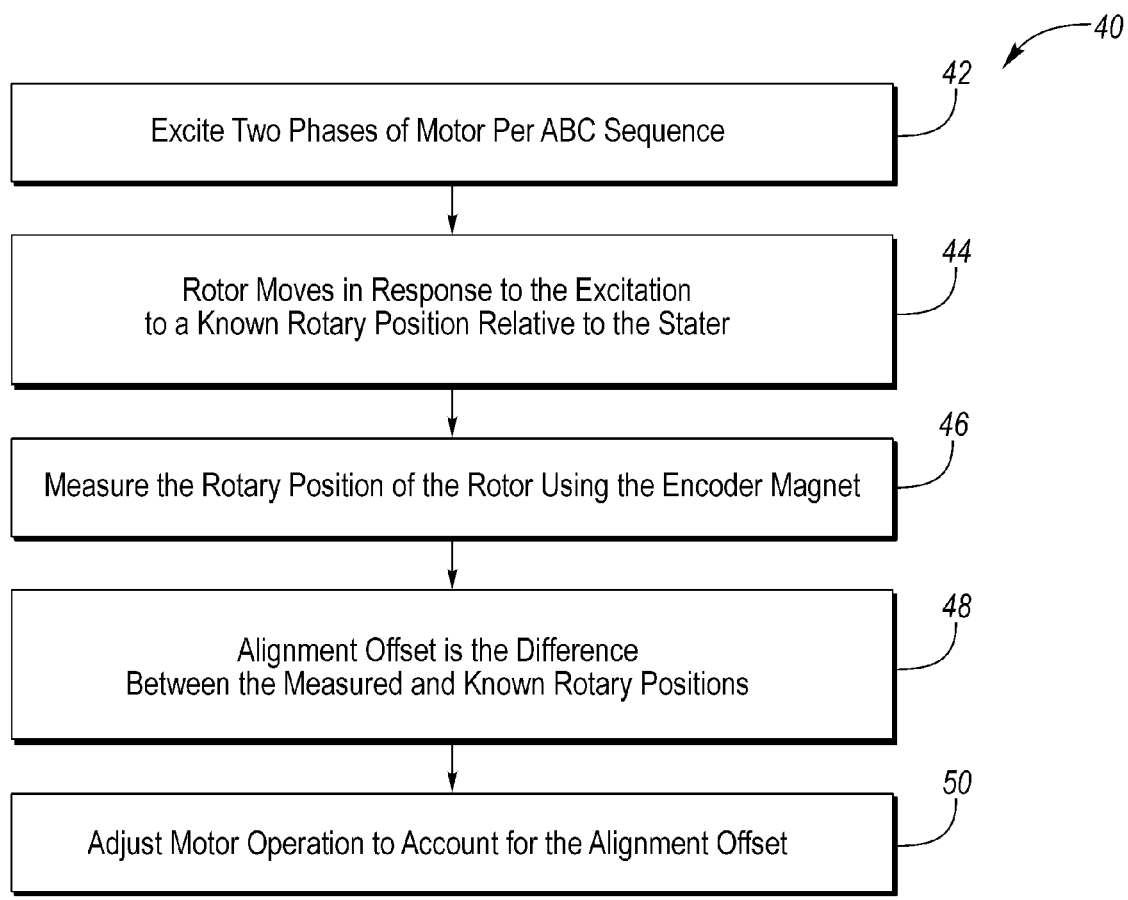
FIG. 3 illustrates a flowchart depicting operation of calibrating and detecting offset in alignment between the encoder magnet and the reference point of the rotor in accordance with an embodiment of the present invention.

Referring now to FIG. 3, with continual reference to FIGS. 1, 2A, and 2B, a flowchart 40 depicting operation of calibrating and detecting for alignment offset in alignment between encoder magnet 30 and a reference point of rotor 14 from which the rotary position of the rotor is to be measured in accordance with an embodiment of the present invention. Initially, the convention of motor rotation direction is fixed so that increasing angle measurement corresponds to clockwise movement of rotor 14 relative to stator 12.

Figure 5A:
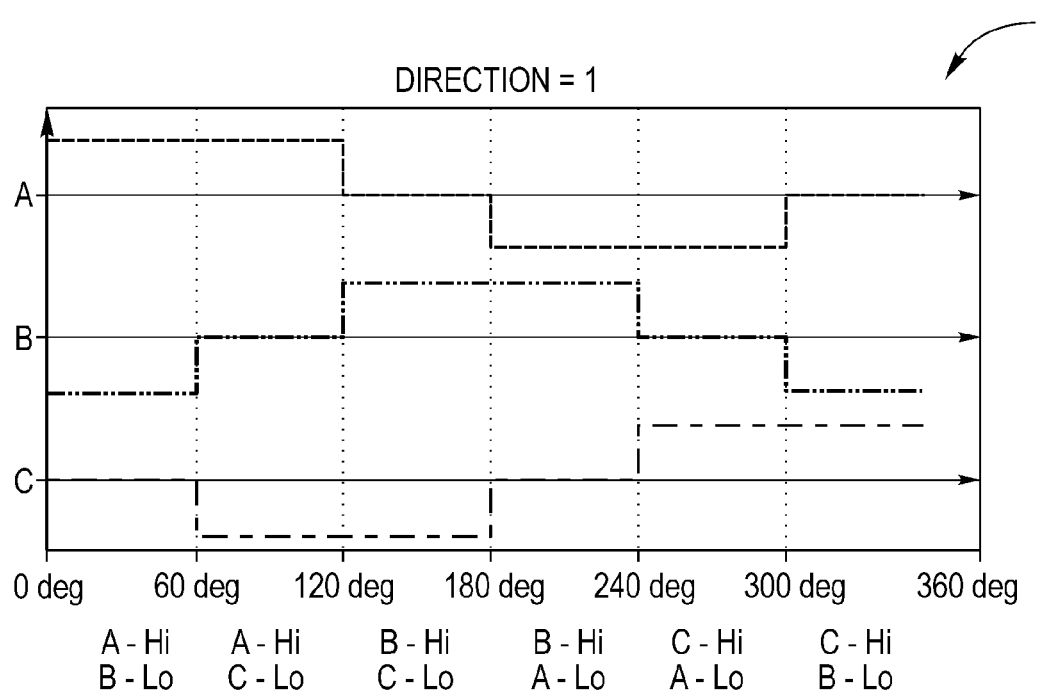
FIG. 5A illustrates a motor commutation sequence in accordance with embodiments of the present invention.

The operation begins with exciting two phases of motor 10 according to a standard motor commutation sequence, such as the ABC sequence shown in FIG. 5A, as indicated in block 42. For instance, phases A and B are excited and phase C is not excited. In this case, for example, phase A is excited HI and phase B is excited LO according to "Step 1" of the ABC sequence shown in FIG. 5A. Rotor 14 moves in response to the excitation. In particular, rotor 14 moves in response to the excitation to a known rotary position relative to stator 12 as indicated in block 44. The rotary position which rotor 14 moves to is known as the positions of stator poles 20 and the excitation (phase A HI and phase B LO) are known. Rotor 14 remains locked at the known rotary position while the excitation continues due to the interaction with the generated magnetic fields. The reference point of rotor 14 from which the rotary position of the rotor is to be measured is defined in relation to the known rotary position (e.g., the reference point of rotor 14 is at the known rotary position after rotor 14 moves in response to the excitation to the known rotary position).

While rotor 14 remains fixed in place, the rotary position of encoder magnet 30 is measured using encoder 28 as indicated in block 46. The measured position of encoder magnet 30 and the known rotary position of rotor 14 are then compared to one another. Any difference between the measured position of encoder magnet 30 and the known rotary position of rotor 14 is the alignment offset as indicated in block 48.

The alignment offset is the offset in alignment between encoder magnet 30 and rotor 14. There is no alignment offset when the encoder magnet 30 is aligned with the reference point of rotor 14. In this case, encoder magnet 30 is at the known rotary position when rotor 14 is at the known rotary position. More generally, in this case, the rotary position of encoder magnet 30 corresponds to the rotary position of rotor 14. However, this case is almost non-existent as practically some alignment offset will be present between encoder magnet 30 and the reference point of rotor 14. As such, encoder magnet 30 is out of alignment with the reference point of rotor 14 in the amount of an alignment offset. Therefore, the rotary position of encoder magnet 30 differs from the rotary position of rotor 14 in the angular amount of the alignment offset.

As an example, the known rotary position of rotor 14 after the rotor moves in response to the excitation is 30°. If the measured rotary position of encoder magnet 30 is 34°, then the alignment offset is 4° (34°−30°=4°); if the measured rotary position of encoder magnet 30 is 78°, then the alignment offset is 48° (78°−30°=48°); etc.

As indicated in block 50, the operation of motor 10 is adjusted to take into account the alignment offset. For instance, if the alignment offset is 4°, then each detected rotary position of encoder magnet 30 taken during operation of motor 10 is adjusted by subtracting 4° therefrom to obtain the rotary position of rotor 14. For instance, if the detected rotary position of encoder magnet 30 at a given instant of time is 96°, then this measurement is adjusted by subtracting 4° therefrom to arrive at 92° for the rotary position of rotor 14. Motor commutation is controlled according to the rotary position of rotor 14 which is 92°. In this way, operation of motor 10 takes into account alignment offset between encoder magnet 30 and the reference point of rotor 14 from which the rotary position of the rotor is to be measured.

The operation of blocks 42, 44, 46, and 48 may be repeated a finite amount of times to obtain an average value of the alignment offset over multiple measurements. The average value should be more accurate of the alignment offset. Additionally or alternatively, the operation of blocks 42, 44, 46, and 48 may be repeated a finite amount of times more or all of the phase excitations of the motor commutation sequence. For instance, the operation of blocks 42, 44, 46, and 48 may be conducted a first time with the excitation of phase A HI and phase B LO and then a second time with the excitation of phase A HI and phase C LO, etc., according to the ABC motor commutation sequence shown in FIG. 5A. This will result in detecting for alignment offset at different known rotary positions of rotor 14. Different values in the alignment offset corresponding to the different known rotary positions of rotor 14 can be averaged or the like to provide a more accurate value of the alignment offset. The repeating measurements of excitation steps and the repeating cycles may be done to take into account winding asymmetry and rotor magnet asymmetry.

As described, operating motor 10 in accordance with embodiments of the present invention involves: rotor offset angle calibration—measuring rotor position with respect to stator windings such as depicted in the operation of flowchart 40 of FIG. 3; calculate rotor electrical position from measured initial absolute position, rotor offset, incremental position, and number of rotor pole pairs; and motor commutation—exciting motor phases in the right sequence as per the rotor angle. The motor phase lead connections to the controller board should remain unchanged.

Figure 4:
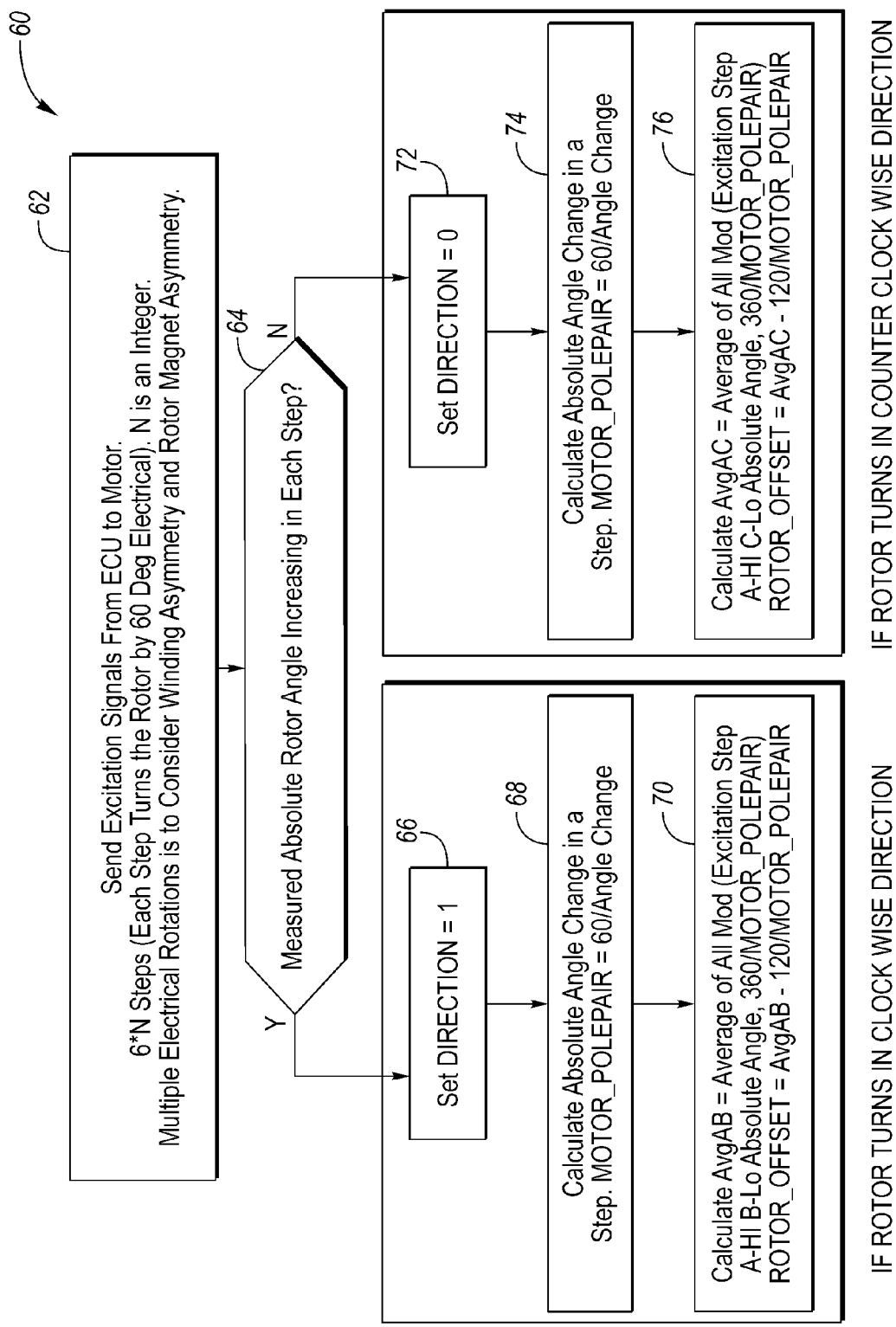
FIG. 4 illustrates a flowchart depicting a detailed rotor offset calibration algorithm in accordance with another embodiment of the present invention.

Referring now to FIG. 4, with continual reference to FIGS. 1, 2A, 2B, and 3, a flowchart 60 depicting a detailed rotor offset calibration algorithm in accordance with another embodiment of the present invention is shown. The operation is preceded by fixing the convention of motor rotation direction so that increasing angle measurement corresponds to clockwise movement of rotor 14 relative to stator 12 and decreasing angle measurement corresponds to counter-clockwise movement of the rotor relative to the stator.

The operation begins with transmitting excitation signals onto coils 22, 24, and 26 from an electronic controller unit (not shown) to motor 10 as indicated in block 62. The excitation signals are transmitted in a pattern according to a standard motor commutation sequence such as the ABC sequence shown in FIG. 5A. As such, a single electrical rotation includes six excitation steps in which in each excitation step two phases of motor 10 are excited and the remaining phase is not excited. In particular, the ABC sequence shown in FIG. 5A includes the following six excitation steps: step 1—phase A HI, phase B LO; step 2—phase A HI, phase C LO; step 3 phase B HI, phase C LO; step 4 phase B HI, phase A LO; step 5—phase C HI, phase A LO; and step 6—phase C HI, phase B LO. Rotor 14 moves in response to each excitation step. In particular, each excitation step rotates rotor 14 by 60 electrical degrees. The motor commutation sequence may be performed N times where N is an integer. Repeating the motor commutation sequence N times to thereby provide multiple electrical rotations is done to take into consideration any winding asymmetry and rotor magnet asymmetry.

During each excitation step, rotor 14 moves in response to the excitation to a corresponding known rotary position relative to stator 12. The rotary position of encoder magnet 30 is then measured using encoder 28. The next excitation step commences. Rotor 14 moves in response to the next excitation to another known rotary position and encoder 28 measures the rotary position of encoder magnet 30. This process continues for each excitation step. The measured rotary position of rotor 14 is analyzed to determine whether the rotary position of encoder magnet 30 is increasing or decreasing as indicated in block 64. Increasing rotary position is indicative of rotor 14 rotating clockwise whereas decreasing rotary position is indicative of the rotor rotating counter-clockwise.

When rotor 14 is detected to be moving clockwise a DIRECTION variable is set to one as indicated in block 66. The absolute angle change for the current excitation step is then calculated as indicated in block 68. The absolute angle change for the current excitation step is the difference in magnitude between the measured rotary position of encoder magnet 30 and the measured rotary position of the encoder magnet for the previous excitation step. As noted, each excitation step causes rotor 14 to rotate by 60 electrical degrees. The mechanical degrees at which rotor 14 turns is related to the electrical degrees by the ratio: (electrical degrees)/(rotor pole pairs). Block 68 includes determining the number of rotor pole pairs (MOTOR_POLEPAIR) using the equation: 60°/Angle Change. In this case with motor 10 having two rotor pole pairs, the angle change will be 30° in an excitation step thereby assigning MOTOR_POLEPAIR with the correct value of two.

The operation continues with determining the amount of alignment offset (labeled "ROTOR_OFFSET") between encoder magnet 30 and rotor 14 as indicated in block 70. For each excitation step the measured rotary position of encoder magnet 30 and the known rotary position of the rotor are compared to one another. The difference between these measured and known positions in an excitation step is the alignment offset between encoder magnet 30 and rotor 14 for the excitation step.

In block 70, as an example, the alignment offset is determined using N measurements of rotary position of encoder magnet 30 respectively obtained for N step 1 excitations (phase A HI, phase B LO). The averaged value of the N measurements of the rotary position of encoder magnet 30 is taken to be the measured rotary position of the encoder magnet (labeled "AvgAB"). The averaged measured rotary position of encoder magnet 30 (AvgAB) is compared with the known rotary position of rotor 14 to determine the alignment offset. In this example as shown in block 70 the alignment offset (ROTOR_OFFSET) is calculated according to the following equation: ROTOR_OFFSET=AvgAB−(120/MOTOR_POLEPAIR).

As described, the term AvgAB is the averaged measured rotary position of encoder magnet 30. The term (120/MOTOR_POLEPAIR) is the known rotary position of rotor 14 (in this case, 60°).

The process described is for the case when rotor 14 is detected to be moving clockwise. On the other hand, when rotor 14 is detected to be moving counter-clockwise the DIRECTION variable is set to zero as indicated in block 72. In correspondence with block 68 as described above, in block 74 the absolute angle change for the current excitation step and the amount of rotor pole pairs (MOTOR_POLEPAIR) are calculated. Next, in correspondence with block 70 as described above, the amount of alignment offset between encoder magnet 30 and rotor 14 is determined in block 76.

In block 76, the alignment offset is determined using N measurements of rotary position of encoder magnet 30 respectively obtained for N step 1 excitations (phase A HI, phase C LO). The averaged value of the N measurements of the rotary position of encoder magnet 30 is taken to be the measured rotary position of encoder magnet 30 (labeled "AvgAC"). The averaged measured rotary position of encoder magnet 30 (AvgAC) is compared with the known rotary position of the rotor to determine the alignment offset. In this example as shown in block 70 the alignment offset is calculated according to the following equation:

ROTOR_OFFSET=AvgAC−(120/MOTOR_POLEPAIR).

As described, the term AvgAC is the averaged measured rotary position of encoder magnet 30 and the term (120/MOTOR_POLEPAIR) is the known rotary position of rotor 14 (in this case, 60°).

Figure 5B:
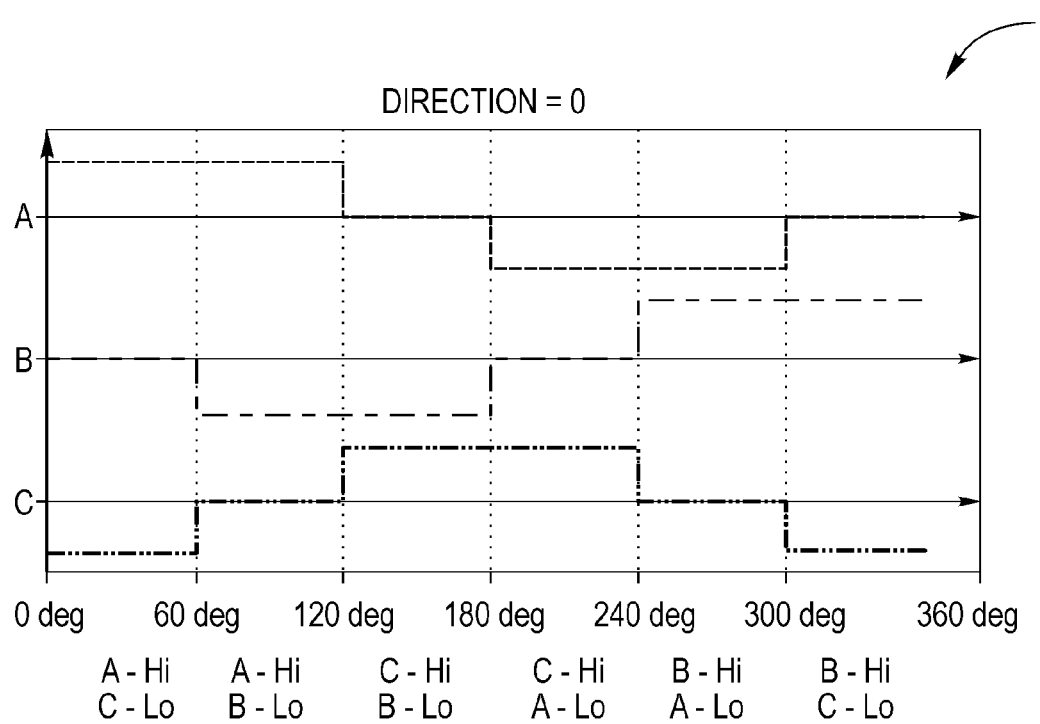
FIG. 5B illustrates another motor commutation sequence in accordance with embodiments of the present invention.

Upon completion of the rotor offset calibration algorithm in flowchart 60 of FIG. 4, operation of motor 10 is adjusted to take into account the alignment offset. In particular, from the rotor offset angle calibration the following information is obtained: direction of rotation—DIRECTION; rotor offset angle—ROTOR_OFFSET; and motor pole pair—MOTOR_POLEPAIR. Motor commutation of motor 10 is performed using the these pieces of information as follows: calculate rotor electrical position from measured initial absolute position, ROTOR_OFFSET, incremental position, and the MOTOR_POLEPAIR; and excite the phases of motor 10 per sequence 80 of FIG. 5A or sequence 90 of FIG. 5B depending upon rotor electrical angle and direction information from the rotor offset angle calibration step.

Figure 6:
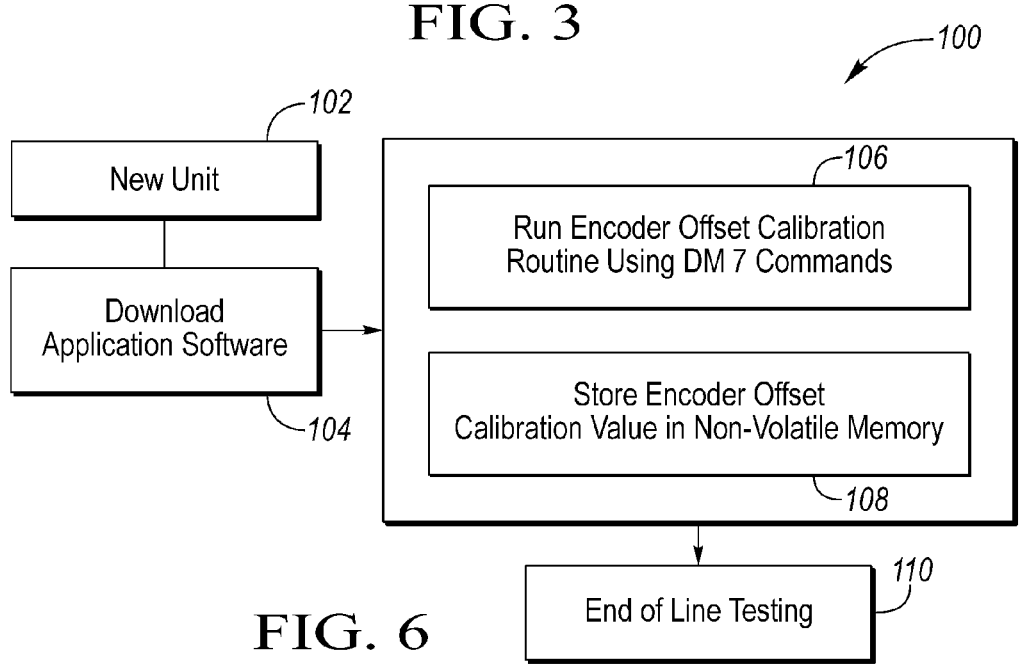
FIG. 6 illustrates a flowchart depicting operation involving rotor offset angle calibration in accordance with an embodiment of the present invention.

Referring now to FIG. 6, a flowchart 100 depicting operation involving rotor offset angle calibration in accordance with an embodiment of the present invention. The operation starts with a newly manufactured motor as indicated in block 102. Application software such as the rotor offset calibration algorithm is downloaded into the motor controller of the motor as indicated in block 104. The offset calibration algorithm is then run in order to detect any alignment offset as indicated in block 106. The detected amount of alignment offset is then stored in memory accessible to the motor controller as indicated in block 108. The end of line testing is then finished as indicated in block 110. Subsequent motor operation takes into account the detected amount of alignment offset stored in the memory according to block 108. The offset calibration algorithm pursuant to block 106 may be run any number of times during the operation lifetime of the motor. The updated detected amounts of alignment offset are stored in the memory in place of previously detected amounts of alignment offset.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A method for operating a motor, comprising:
    applying a predetermined excitation pattern to stator poles to rotate a rotor through a series of positions, the excitation pattern comprising a varied series of high and low signals;
    solving for a series of reference points for the rotor relative to the stator poles at each of the series of positions based on the predetermined excitation pattern;
    measuring a series of encoder alignments at each of the series of positions;
    comparing the series of encoder alignments to the series of reference points to determine an alignment offset between the encoder and the rotor; and
    adjusting the operation of the motor based on the alignment offset.

2. The method of claim 1, further comprising determining a direction of rotation of the rotor.

3. The method of claim 2, wherein the excitation pattern varies based on the determined direction of rotation of the rotor.

4. The method of claim 2, further comprising selecting among different predetermined excitation patterns to apply to stator poles based on the determined direction of rotation of the rotor.

5. The method of claim 1, further comprising calculating a number of rotor pole pairs.

6. The method of claim 1, further comprising calculating an absolute angle change for each of the series of positions.

7. The method of claim 6, further comprising calculating a number of rotor pole pairs based on the absolute angle change calculations.

8. The method of claim 6, further comprising storing the alignment offset and iteratively measuring encoder alignments and comparing the measured encoder alignments to the stored alignment offset, and, when the stored alignment offset does not equal the measured encoder alignments, recalculating the alignment offset.

9. The method of claim 1, further comprising iteratively determining the alignment offset and calculating an average alignment offset so as to account for asymmetries in the motor structure.

10. The method of claim 1, wherein the encoder is an encoder magnet, and wherein a fixed magnetic sensor is used to perform the step of measuring a series of encoder alignments.

11. The method of claim 1, wherein, to rotate through the series of positions, the rotor rotates stepwise through 360 Degrees.

12. A method for operating a motor, comprising:
    applying a pre-programmed excitation pattern to stator poles to rotate a rotor to a known position, the excitation pattern comprising a set of high and low signals to the stator poles;
    solving for a known rotary position for the rotor relative to the stator poles using the pre-programmed excitation pattern;
    calculating a reference point for the rotor relative to the known rotary position;
    measuring an encoder alignment at the known rotary position;
    comparing the encoder alignment to the reference point to determine an alignment offset between the encoder and the rotor; and
    adjusting the operation of the motor based on the alignment offset.

13. The method of claim 12, further comprising calculating a number of rotor pole pairs.

14. A motor assembly comprising:
    a rotor comprising rotor poles;
    three sets of stator poles with respective coil windings forming three phases;
    circuitry for applying an excitation pattern to the respective coil windings for rotating the rotor through a series of positions;
    an encoder associated with the rotor; and
    a controller configured to:
        apply a pre-programmed excitation pattern to the three sets of stator poles to rotate the rotor to a known position, the excitation pattern comprising a set of high and low signals;
        solving for a known rotary position for the rotor relative to the three sets of stator poles using the pre-programmed excitation pattern;
        calculate a reference point for the rotor relative to the known rotary position;
        measure an encoder alignment at the known rotary position;
        compare the encoder alignment to the reference point to determine an alignment offset between the encoder and the rotor; and adjust the operation of the motor based on the alignment offset.

15. The assembly of claim 14, wherein the controller is further configured to calculate a number of rotor pole pairs.

16. The assembly of claim 14, wherein the controller is further configured to determine a direction of rotation of the rotor.

17. The assembly of claim 16, wherein the controller is further configured to select among different predetermined excitation patterns to apply to the three sets of stator poles based on the determined direction of rotation of the rotor.

* * * * *